Aug. 23, 1960 D. J. CARLSON 2,950,383

FREQUENCY CONVERTER WITH OSCILLATOR TUNING INDUCTOR

Filed Aug. 22, 1957

INVENTOR.

DAVID J. CARLSON

BY [signature]

ATTORNEY 2,950,383

FREQUENCY CONVERTER WITH OSCILLATOR TUNING INDUCTOR

David J. Carlson, Haddon Heights, N.J., assignor to Radio Corporation of America, a corporation of Delaware Filed Aug. 22, 1957, Ser. No. 679,636

9 Claims. (Cl. 250—20)

This invention relates generally to frequency converters, and more particularly to self-oscillating converters of the type wherein the generation of the local heterodyning wave and the mixing thereof with a signal from an external source is effected in a single electron discharge device.

In wide band high frequency superheterodyne receivers such as television receivers it is necessary that the frequency converter or mixer stage efficiently combine signals corresponding to any one of a plurality of television channels in the wide frequency range between 54 megacycles (channel 2) and 216 megacycles (channel 13) with locally generated oscillator signals differing in frequency by a fixed amount from the selected channel frequency. As a result of the technical problems involved in providing acceptable conversion over this frequency range it has been the general practice in the design of television receivers to use separate mixer and oscillator stages. This results in a circuit of increased cost and complexity due to the additional components required. One reason why previous attempts to provide a self-oscillating converter stage operable over such a wide range of frequencies have been unsuccessful is due to the serious loading problems particularly at high frequencies. The input resistance of a converter stage varies approximately as the inverse function of the square of the frequency of operation. At the upper end of the frequency range the input resistance is quite low being on the order of 200 ohms. Since the source resistance is ordinarily much larger, a considerable mis-match loss occurs in the transfer of signal energy to the converter, resulting in inefficient converter operation.

An object of the present invention is to provide an improved frequency converter.

A further object of this invention is to provide an improved and simplified frequency converter efficiently operable in the upper portion of the VHF television band wherein mis-match losses between the source and load impedances is minimized.

It is another object of this invention to provide an improved frequency conversion stage for television receivers using only a single discharge device which is efficiently operable to effect generation of a local oscillation wave and the mixing thereof with a received signal modulated radio frequency carrier wave.

In accordance with the invention, the converter stage includes a multi-grid electron discharge device at least there electrodes of which are connected to operate as an oscillator, the frequency of which is determined by a resonant circuit. A signal input circuit for the converter stage is connected to the signal input electrode of the multi-grid tube through an impedance matching network which includes as an element thereof the oscillator resonant circuit. In superheterodyne receivers, as the oscillator resonant circuit is tuned in tracking relation with a signal selection circuit, the impedance matching network is automatically adjusted to maintain an approximate impedance matching relation between the load comprising the multi-grid tube and the signal input circuit for the converter.

Accordingly a still further object of this invention is to provide an improved and simplified converter having efficient signal coupling to the converter signal input electrode over a relatively wide range of high frequencies.

The novel features which are considered to be characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
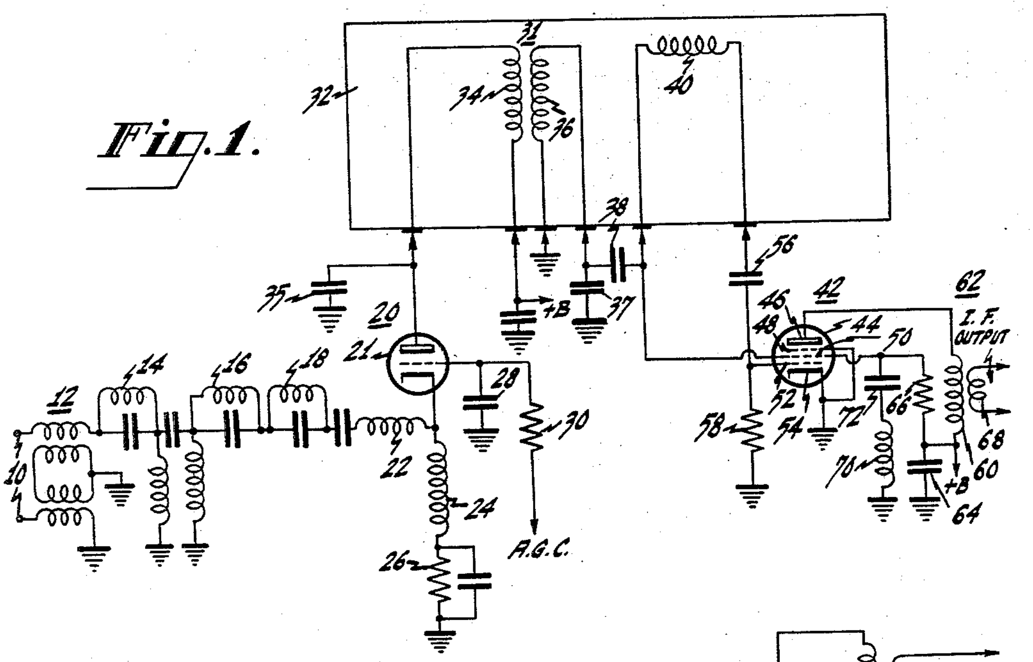
Figure 1 is a schematic circuit diagram of an R.F. amplifier and a single tube mixer-oscillator embodying the invention, as incorporated in a turret tuner for television receivers.

Referring now to the drawings and particularly to the tuner illustrated in Figure 1, a pair of signal input terminals 10 are provided for connection through a suitable transmission line, not shown, to an antenna or other signal source. In the present instance the tuner is designed for operation in a television receiving system, and as such is capable of selecting any one of a plurality of television channels in the frequency ranges including 54 to 88 megacycles (channels 2 to 6) and 176 to 216 megacycles (channels 7 to 13). The signals at the input terminals 10 are applied to an elevator transformer 12 which couples the balanced transmission line circuit to the unbalanced receiver input circuit. A pair of intermediate frequency trap circuits 14 and 16, and an FM trap circuit 18 are connected in series between the elevator transformer 12 and the input circuit of a grounded-grid radio frequency (R.F.) amplifier stage 20.

The input circuit for the R.F. amplifier stage 20 may be conveniently divided into two sections. The first section for channels 7–13 includes a first inductor 22 which is series resonant with the input capacitance of a triode electron tube 21 near the high frequency end of the upper VHF television band (channel 13). The second section for channels 2–6 includes a second inductor 24 and the input capacitance of the tube 21 which form a parallel resonant circuit tuned to a frequency in the lower of the two VHF television bands. The inductor 24 presents a relatively high impedance to signals in the upper VHF television band so as not to affect the peaking operation of the series circuit including the inductor 22. The control grid of tube 21 is effectively grounded for signal frequencies by a bypass capacitor 28, and a source of automatic gain control potential (AGC) is applied to the grid through a resistor 30.

The R.F. amplifier output circuit comprises a tuned coupling transformer 31 mounted on a tuning circuit strip 32 of the type which is adapted for placement in a turret tuner. Ordinarily one circuit strip is provided for each of the twelve channels in the VHF television band and one or more strips for selected UHF channels. In most turret tuners, the circuit strips are longitudinally positioned about the periphery of a drum or turret member which is rotatable with respect to the tuner chassis. Connection from the circuit strips to the television receiver circuits is made through a plurality of contact buttons on the circuit strips and stationary cooperating contact elements mounted on the tuner chassis. Predetermined ones of the circuit strips may be connected with the receiver by rotation of the turret member to bring the contact buttons on the desired cricuit strip into contact with the stationary contact elements. Although the frequency converter of the present invention is described in connection with a turret tuner, it should be understood that the specific tuning devices or structures per se form no part of the invention and are illustrated and described to enable a more complete understanding of this invention. By way of example, the converter may also be used with television receivers or the like employing step by step VHF tuners and continuous UHF tuners, or alternatively where both the UHF and VHF tuners are continuously tuned.

The amplified R.F. signal is developed across a primary winding 34 of the coupling transformer 31 and is inductively coupled to a secondary winding 36. The primary winding 34 which is connected between the anode of the tube 21 and a source of operating potential +B is tuned by a capacitor 35 to the frequency of a particular television channel. Likewise the secondary winding 36 is tuned by a capacitor 37 to substantially the same frequency. The high signal potential side of the secondary winding 36 is connected by way of a capacitor 38 and an inductor 40 which form part of an impedance matching network to a frequency converter stage 42. The frequency converter stage combined the oscillator and mixer functions into a single tube 44, having an anode 46, suppressor grid 48, screen grid 50, control grid 52, and cathode 56. By way of example, the tube 44 may comprise the pentode section of a 6U8 type tube, the triode portion thereof being used in the R.F. amplifier stage 20.

Specifically the high signal potential side of the secondary winding is connected through the series connection of the capacitor 38 and the inductor 40 and a D.C. blocking capacitor 56 to the control grid 52 of the mixer tube 44. The screen grid 50 is connected to the control grid 52 through the blocking capacitor 56 and the inductor 40, the inductance of which determines the frequency of oscillation of the oscillator portion of the converter stage 42. The inductor 40 serves the dual function of providing an element of an impedance matching network between the signal source and the input electrode 52 as well as providing the frequency determining element of the oscillator portion of the converter stage. The cathode 54 of the converter tube 44 is grounded, and a resistor 58 completes the D.C. path between the control grid 52 and the cathode 54.

The heterodyning of the radio frequency signal with the locally generated oscillation signal in the converter stage 42 produces a corresponding intermediate frequency signal which is developed across the primary winding 60 of an intermediate frequency transformer 62. A source of operating potential +B which is suitably bypassed to ground by a capacitor 64 is connected through the primary winding 60 of the I.F. transformer 62 to the anode 46 of the converter tube 44. The screen grid 40 is also connected through a resistor 66 to the +B operating potential supply. The intermediate frequency signal is coupled to a secondary winding 68 for application to the remaining portion of a television receiver (not shown).

In considering the oscillator portion of the converter stage 44 it will be seen that the R.F. signal is applied through the coupling capacitor 38 to the screen grid 50 of the tube 44. However, due to the low conversion transconductance of the screen grid 50, the R.F. signal thereon has very little effect on the signal developed across the primary winding 60 of the intermediate frequency transformer 62.

The screen grid 50 comprises the anode for the oscillator portion of the converter stage 42. The frequency of operation of the oscillator is determined by the inductance of the inductor 40 together with the interelectrodal capacitances in parallel therewith including the capacitance between the screen grid 50 and and control grid 52. The screen grid 50 to suppressor grid 48 capacitance in series with the control grid 52 to cathode 54 capacitance is also connected across the inductor 40. The oscillator is essentially a modified Colpitts configuration in that the capacitance between the control grid 52 and the cathode 54 and the capacitance between the screen grid 50 and the grounded suppressor grid 48 provides the split capacity arrangement.

In the operation of a converter at frequencies near the upper end of the television band, the loading of the converter tube becomes extremely severe. As checked experimentally, the input resistance at channel 13 of a converter stage using the pentode section of a 6U8 type tube is on the order of 200 ohms. Additionally the input resistance is frequency sensitive and varies as the inverse function of the square of frequency. Since the source resistance is of a much larger value, on the order of 6,300 ohms for channel 13 and 21,000 ohms for channel 2, a serious mismatch and accompanying loss of efficiency in the transfer of power between the source and the load results unless an impedance matching network is provided.

Figure 2:
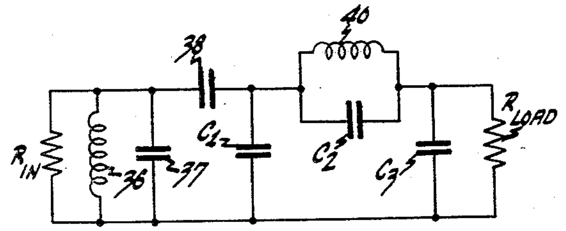
Figure 2 is an equivalent circuit diagram of the converter circuit shown in Figure 1.

In considering the impedance matching network reference is made to Figure 2 which is an equivalent circuit diagram of a frequency converter shown in Figure 1. The resistor indicated as $R_{in}$ corresponds to the equivalent resistance loading of the input circuit, and the resistor marked $R_{load}$ represents the input loading at the frequency control grid 52 which is inversely proportional to the square of frequency. The capacitor $C_1$ is the screen grid to ground capacitance, the capacitor $C_2$ is the interelectrode capacitance existing between the screen grid 50 and the control grid 52, and the capacitor $C_3$ represents the interelectrode capacitance between the screen grid 50 and the grounded suppressor grid 48.

In general the impedance matching circuit comprises a four-terminal network including the capacitor $C_1$, $C_2$ and $C_3$ and the inductor 40. The values of these elements may be supplemented, or adjusted in accordance with well known design principles to provide the desired matching characteristics. Since the resistor representing the input resistance is greater than the resistor representing load resistance, the element (capacitor 38) connecting the oscillator and signal selection circuit is a capacitor. Conversely if the load resistance is greater than the input resistance, the element connecting the signal selection circuit with the oscillator circuit should comprise an inductor.

As a practical matter the relative values of the capacitors 37 and 38 and the inductors 36 and 40 are selected for minimum mismatch at channel 13. In tuning to lower channel frequencies using such a circuit configuration, it was found that a relatively close impedance match was maintained between the source and the load. If desired, optimum impedance match could be attained at each channel frequency by including the capacitors corresponding to the capacitors 37 and 38 on each turret strip. However this would require additional capacitors thereby increasing the cost of the circuit.

As mentioned above, the R.F. signal applied to the control grid 52 is heterodyned with the local oscillator signal to produce a corresponding I.F. signal which is developed across the I.F. transformer primary winding 60. A series resonant circuit comprising an inductor 70 and a capacitor 72 tuned slightly above the I.F. is connected between the screen grid 50 and ground. This prevents a loss of I.F. output across the I.F. transformer primary winding 60 due to degeneration caused by an out-of-phase component of the I.F. signal appearing at the screen grid 50.

By way of example the following values of circuit constants were found to give excellent conversion operation in a circuit of the type described.

Capacitor 37—2.5 micro-micro farads
Capacitor 38—2 micro-micro farads
Capacitance between screen grid and ground—5.5 mmf.
Capacitance between screen grid and control grid—4.8 mmf.

Capacitance between control grid and ground—4.6 mmf.
Inductor 36:
.150 micro henries (channel 13)
2.40 micro henries (channel 2)
Inductor 40:
.083 micro henries (channel 13)
1.33 micro henries (channel 2)

Figure 3:
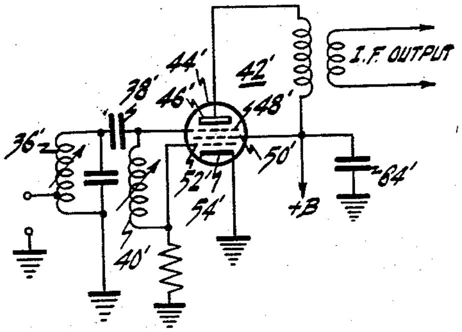
Figure 3 is a schematic circuit diagram of a modification of the frequency converter shown in Figure 1.

The converter stage shown in Figure 3 is essentially the same as that shown in Figure 1 except that the coupling capacitor 38′ is connected ot the suppressor grid 48′ which operates as the anode of the oscillator section. This has the advantage of eliminating the need for the D.C. blocking capacitor corresponding to the capacitor 56 shown in Figure 1. As mentioned above in connection with Figure 1, the tuning inductors 36′ and 40′ may comprise separate elements placed on the tuning strip of a turret tuner, or switched inductance elements of a wafer switch type tuning element or the like. Additionally, the screen grid 50′ is bypassed to ground for signal frequencies by the filter capacitor 64′.

Figure 4:
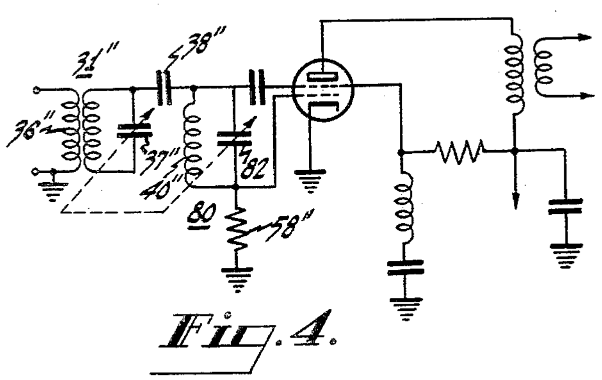
Figure 4 is a schematic circuit diagram of a single tube mixer-oscillator illustrating another embodiment of the invention.

With reference to Figure 4, which shows an embodiment of the converter circuit of the invention wherein the tuning elements of the signal selection and oscillator circuits comprise variable capacitors. The radio frequency signal input is applied across the primary 34″ of the coupling transformer 31″, the secondary 36″ of which is tuned by a variable capacitor 37″. The signal developed across the tuned secondary circuit is applied to the control grid of the converter tube through a coupling capacitor 38″ and a tunable circuit 80 comprising an inductor 40″ and another variable capacitor section 82 which is ganged with the tuning capacitor 37″. The operation of the oscillator portion of the converter tube is substantially the same as that described above in connection with Figure 1 with the exception that the oscillator is capacitively tuned. The tuned input circuit, the coupling capacitor 38″, the oscillator tuning circuit 80, and the input capacitances of the converter stage form an impedance matching network between the source including the tuned secondary circuit, and the load as presented between the control grid of the converter and ground. As the signal selection and oscillator circuits are tuned in tracking relation, an approximate impedance match is always maintained. Thus it can be seen in accordance with the foregoing that the tuned oscillator circuit 80 serves a dual function of tuning the oscillator to the desired heterodyning frequency, and providing a portion of an adjustable impedance matching network which enables the signals to be efficiently transferred from the source to the load.

The frequency converter circuit described enables efficient signal transfer between the signal input circuit and the converter tube signal input electrode by virtue of an impedance matching network which includes the tuning element of the local oscillator circuit. The impedance matching is automatically adjusted as the oscillator is tuned in tracking relation with the signal selection circuits to maintain efficient signal transfer over a wide frequency range.

What is claimed is:

1. A frequency converter comprising an oscillation generator including a resonant circuit having tuning means for adjusting a frequency of said resonant circuit over a band of frequencies, a signal input circuit, a signal input terminal for said converter, and means connecting at least a portion of said tuning means in series between said signal input circuit and said signal input terminal for said converter.

2. In a frequency converter of the type including a multi-grid tube having a signal input terminal and an oscillator portion including a resonant circuit having a tuning element for tuning said resonant circuit over a band of frequencies, a tunable signal input circuit, and means connecting said tunable signal input circuit to said signal input terminal including the tuning element of said resonant circuit to provide an impedance matching network the impedance matching ratio characteristic of which is adjusted by varying the tuning of said resonant circuit.

3. A high frequency converter circuit for television receivers or the like comprising in combination, an electron discharge device including at least an anode, a screen grid, a control grid, and a cathode, means connecting said screen grid, control grid, and cathode to operate as a modified Colpitts oscillator including inductance means connected between said screen grid and said control grid, the frequency of oscillation of said oscillator being adjustable over a range of frequencies by changing the value of said inductance means, a signal input circuit tunable to the frequency of any one of a plurality of television channels, a coupling capacitor connected between the high signal potential side of said input circuit and said screen grid whereby signals are conveyed to said control grid through at least a portion of said inductance means, and an output circuit connected between said anode and cathode tuned to the frequency difference between the frequency of said desired television channel and the frequency of said oscillator.

4. In a frequency converter circuit, an electron discharge device including at least an anode, a screen grid, a control grid and a cathode, an oscillation circuit including adjustable inductance means connected to said screen grid to provide a frequency determining element for said oscillation circuit for tuning said oscillation circuit to different frequencies in a wide band of frequencies, a tunable signal input circuit, and means connecting said adjustable inductance means in series between said signal input circuit and said control electrode.

5. In a frequency converter circuit, an electron discharge device including at least an anode, a screen grid, a control grid and a cathode, a tunable oscillation circuit including adjustable inductance means connected between said screen grid and said control grid for tuning said oscillation circuit to different frequencies in a wide band of frequencies, a tunable signal input circuit, and means including said adjustable inductance means coupling said signal input circuit to said control electrode.

6. A high frequency self-oscillating converter stage, the combination comprising an electron tube having at least an anode, suppressor grid, screen grid, a control grid, and cathode, oscillation generator means including a tunable resonant circuit having reactive tuning means for adjusting the frequency of said resonant circuit over a band of frequencies, said reactive tuning means connected between said suppressor grid and said control electrode, a signal input circuit, and impedance matching coupling means including said reactive tuning means connecting said signal input circuit to said control grid for providing a substantial matching of the impedance between said signal input circuit and said input electrode with the tuning of said tunable resonant circuit over a band of frequencies, and intermediate frequency output circuit means connected between said anode and said cathode.

7. A high frequency self-oscillating converter comprising an electron tube having at least an anode, a cathode, a signal input electrode and one other electrode, oscillation means including a tunable resonant circuit having reactive tuning means for adjusting the frequency of said resonant circuit over a band of frequencies, said reactive tuning means connected between said signal input electrode and said other electrode, a signal input circuit, impedance matching coupling means including said reactive tuning means connecting said signal input circuit to said signal input electrode for providing a substantial matching of the impedance between said signal input circuit and said input electrode with the tuning of said tunable resonant circuit over a range of frequencies, and intermediate frequency output circuit means connected between said anode and said cathode.

8. A high frequency converter circuit for television receivers or the like comprising in combination, an electron discharge device including at least an anode, a screen grid, a control grid, and a cathode, means connecting said screen grid, control grid, and cathode as an oscillation generator including adjustable inductance means connected between said screen grid and said control grid, a signal input circuit tunable to the frequency of a desired television channel, means for tuning said oscillation generator and said signal input circuit in unison a coupling capacitor connected between said input circuit and said screen grid whereby signals are conveyed to said control grid through said adjustable inductance means, and an output circuit connected between said anode and cathode tuned to the frequency difference between the frequency of said desired television channel and the frequency of said oscillation generator.

9. A frequency converter comprising in combination, an electron tube including an anode, a screen grid, a control grid, and a cathode, means providing a signal input circuit tunable to the frequency of a signal to be converted to a corresponding signal of different frequency, means connecting said screen grid, control grid and cathode for operation as an oscillator including inductive tuning means connected between said screen grid and said control grid adjustable for tuning said oscillator for operation over a wide band of frequencies, means for tuning said signal input circuit and said oscillator in unison, and a coupling capacitor connecting said signal input circuit with said screen grid, the relative magnitudes of the circuit components being selected so that the source impedance of said signal input circuit is substantially matched with a load impedance of said electron tube presented between said control grid and ground as said signal input circuit and said oscillator are tuned in unison over a range of frequencies.

References Cited in the file of this patent

UNITED STATES PATENTS

| | | |
|---|---|---|
| 2,543,067 | Sanders | Feb. 27, 1951 |
| 2,662,171 | Cock et al. | Dec. 8, 1953 |
| 2,715,211 | Murakami | Aug. 9, 1955 |
| 2,737,580 | Edens et al. | Mar. 6, 1956 |